(12) United States Patent
O'Brien et al.

(10) Patent No.: US 7,518,244 B2
(45) Date of Patent: Apr. 14, 2009

(54) REDUCING LINE TO LINE CAPACITANCE USING ORIENTED DIELECTRIC FILMS

(75) Inventors: Kevin O'Brien, Portland, OR (US); David Gracias, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/103,394

(22) Filed: Apr. 11, 2005

(65) Prior Publication Data

US 2005/0190020 A1 Sep. 1, 2005

Related U.S. Application Data

(62) Division of application No. 10/306,066, filed on Nov. 27, 2002, now Pat. No. 6,927,180.

(51) Int. Cl.
*H01L 23/48* (2006.01)
*H01L 23/52* (2006.01)
*H01L 29/40* (2006.01)

(52) U.S. Cl. .............. 257/758; 257/759; 257/E23.144

(58) Field of Classification Search .......... 257/750, 257/758–760, 776, E23.144, E23.168
See application file for complete search history.

(56) References Cited

U.S. PATENT DOCUMENTS

| | | | | |
|---|---|---|---|---|
| 3,686,591 A | * | 8/1972 | Gikow | 333/167 |
| 5,693,566 A | * | 12/1997 | Cheung | 438/624 |
| 6,137,558 A | * | 10/2000 | Koma et al. | 349/143 |
| 6,376,393 B1 | * | 4/2002 | Newton et al. | 438/783 |
| 7,019,399 B2 | * | 3/2006 | Venkatraman et al. | 257/751 |

* cited by examiner

*Primary Examiner*—Thanhha Pham
(74) *Attorney, Agent, or Firm*—Trop, Pruner & Hu, P.C.

(57) ABSTRACT

By exposing dielectrics to a strong electric field, anisotropic characteristics may be introduced into the dielectric. This may result in the dielectric having different dielectric constants in different directions. As integrated circuits scale, importance of line to line capacitance in one plane increases. Thus, in some embodiments, the dielectric constant of the oriented dielectric may be lower in the plane that controls line to line capacitance.

4 Claims, 1 Drawing Sheet

REDUCING LINE TO LINE CAPACITANCE USING ORIENTED DIELECTRIC FILMS

This is a division of prior application Ser. No. 10/306,066 filed Nov. 27, 2002 now U.S. Pat. No. 6,927,180.

BACKGROUND

This invention relates generally to semiconductor processing and, particularly, to forming interlayer dielectric materials.

Conventional integrated circuits may include an interconnect metal layer which is made up of a large number of metal interconnects. Each of these interconnects may carry signals. Each signal on each interconnect may be affected by line to line capacitance due to adjacent interconnects.

As feature size dramatically decreases, particularly below 1 micron, the contribution to overall capacitance due to line to line capacitance dramatically increases. At the same time, the contribution of layer to layer capacitance dramatically decreases.

Thus, there is a need for better ways to reduce the line to line capacitance of integrated circuits.

DETAILED DESCRIPTION

The line to line capacitance between two metal lines in a particular interconnect metal layer is a function of the dielectric constant of the material between the lines. The material between the lines is an interlayer dielectric or ILD. Generally, ILDs have relatively isotropic dielectric constants. Thus, they neither directionally inhibit nor directionally encourage the generation of capacitance in the horizontal plane of the layer or between layers transverse to the horizontal plane.

However, since the effect of line to line capacitance within a given layer is dramatically more important as feature size decreases, the inventors of the present invention have determined that it may be advantageous to decrease the dielectric constant as seen between metal lines in the same layer. Even if this directionality has the effect of increasing the capacitance because of the adverse dielectric constant created by the same material in the transverse or vertical direction between layers, the reduction of the line to line capacitance has a much greater effect as feature size scales downwardly.

Thus, by generating oriented or anisotropically oriented dielectrics between the metal lines, the dielectric constant, as seen by adjacent metal lines in the same layer, may be substantially decreased, thereby substantially decreasing the line to line capacitance.

In accordance with one embodiment of the present invention, the oriented dielectric material is oriented in a direction transverse to the plane of the metal lines in a particular metal layer. This has the effect of decreasing the dielectric constant as seen by those metal lines. The decreased dielectric constant in turn results in decreased line to line capacitance.

To the extent that the average polarization along the electric field direction is reduced, the capacitance is reduced. In essence, lowering the contribution of the molecular dipole moment by orienting the molecular dipole moment perpendicularly to the field direction can reduce the average polarization all the way to zero in some cases. This reduced molecular dipole moment dramatically reduces the dielectric constant as seen by the adjacent metal lines. In other words, an oriented dielectric, placed between lines, has low polarization in the axis between those lines.

Oriented or anisotropic dielectrics are solids that have anisotropy in polarization, refractive index, or dielectric constant. Suitable materials include organosilicides, polymers, and oxides, to mention a few examples.

Figure 1:
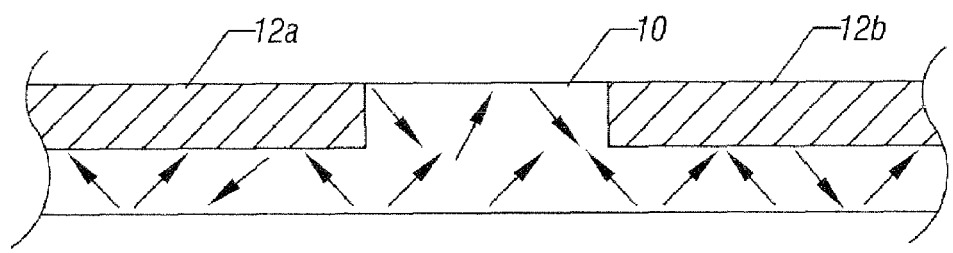
FIG. 1 is an enlarged cross-sectional view of one embodiment of the present invention.

In accordance with one embodiment of the present invention, referring to FIG. 1, the conductive lines 12a and 12b may be separated by a dielectric 10. As shown in FIG. 1, the dielectric 10 exhibits no anisotropy or is essentially isotropic in all directions. If the molecules in the dielectric 10 are oriented vertically, they will tend to be more polarizable in the vertical direction and have low polarizability in the horizontal plane between the lines 12a and 12b.

The dielectric 10 may be a spin-on thin film dielectric in one embodiment. Suitable spin-on dielectric films include polyimides, aromatic polyesters, and polydimethylsiloxanes. These materials are linear and have strong anisotropy with aromatic and polarizable bonds along the direction of the molecule and low polarizability in the direction perpendicular to the chain. These films may be spun-on substrates and oriented at elevated temperatures in strong DC electric fields. In one embodiment, the applied electric field may be greater than 1E5 V/cm.

Figure 2:
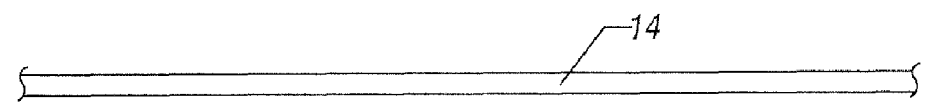
FIG. 2 is an enlarged cross-sectional view of the embodiment shown in FIG. 1 at a subsequent stage in accordance with one embodiment of the present invention.
Figure 2:
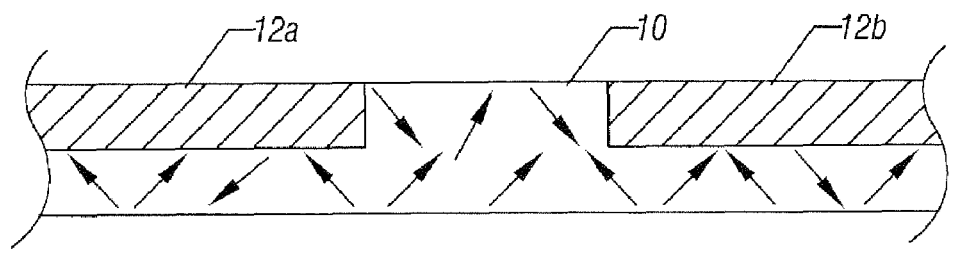
Figure 3:
FIG. 3 is an enlarged cross-sectional view of the embodiment shown in FIG. 2 at a subsequent stage in accordance with one embodiment of the present invention.
Figure 3:
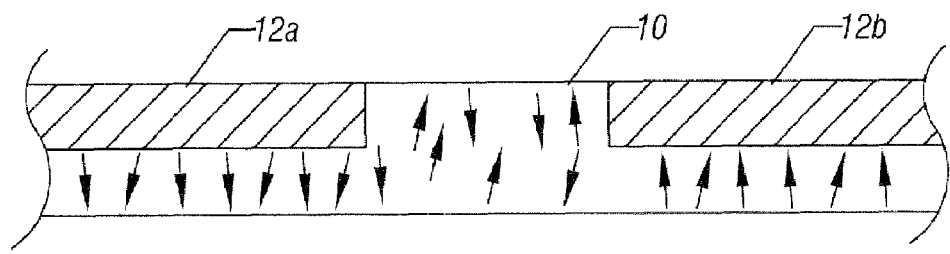

Thus, referring to FIG. 2, an electric field may be applied by plates 14 in the direction transverse to the horizontal plane in which the dielectric 10 and the lines 12 lie. As a result of the applied electric field, an anisotropy may be developed as indicated in FIG. 3. This anisotropy is in the vertical direction, thereby lowering the dielectric constant in a horizontal direction as seen between the lines 12a and 12b. As a result, the line to line capacitance may be reduced.

In accordance with another embodiment of the present invention, carbon doped oxide (CDO) type dielectrics may be deposited to form the structure shown in FIG. 1. CDO dielectrics may, for example, be between about five and fifty percent carbon, and may have a thickness between about 300 and about 3000 nanometers, in some embodiments. Those dielectrics may be cured at elevated temperatures and strong poled electric fields as suggested in FIG. 2.

If the average orientation of the Si—O—Si bond that dominates the polarization of these materials is increased to be more in the vertical direction as compared to the horizontal direction, an anisotropy is developed. By increasing the anisotropy of the CDO, the effective dielectric constant in the layer to layer capacitance may be compromised while decreasing the dielectric constant effectively in the line to line capacitance direction. The poling can be done by adding a strong DC field at the end of the deposition in the chemical vapor deposition chamber while the film is still cooling.

In accordance with still another embodiment of the present invention, liquid crystal materials may be utilized as interlayer dielectrics. Liquid crystal materials are amenable to spontaneous orientation on the molecular level. Spontaneous electrically poled interlayer dielectrics may be formed of liquid crystal materials in accordance with another embodiment of the present invention.

Thus, in some embodiments of the present invention, deferential dielectric constants may be formed which improve capacitance in one direction even if they adversely affect the capacitance in another direction. Particularly where the direction of improvement is within a given layer, in some embodiments, the line to line capacitance may be dramatically improved.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
   a substrate;
   a pair of conductive lines spaced from one another horizontally; and
   a carbon doped oxide single solid dielectric material between said conductive lines, said carbon doped oxide single solid dielectric material having a lower dielectric constant in said carbon doped oxide single solid dielectric material between said conductive lines in a horizontal direction of a horizontal plane extending from one conductive line to another conductive line and a higher dielectric constant in a direction perpendicularly to the horizontal direction and the horizontal plane.

2. The integrated circuit of claim 1 wherein said carbon doped oxide single solid dielectric material has a first dielectric constant in a direction between said conductive lines that is lower than the dielectric constant transverse thereto.

3. The integrated circuit of claim 1 wherein said carbon doped oxide single solid dielectric material exhibits vertical anisotropy in its dielectric constants.

4. The integrated circuit of claim 1, having a capacitance between said conductive lines because of a directional nature of said two different dielectric constants of said carbon doped oxide single solid dielectric material.

* * * * *